(12) United States Patent
Yang et al.

(10) Patent No.: US 7,359,192 B2
(45) Date of Patent: Apr. 15, 2008

(54) COOLING DEVICE FOR HEAT-GENERATING ELECTRONIC COMPONENT

(75) Inventors: Chih-Hao Yang, Guangdong (CN); Yuh-Ching Chang, Guangdong (CN); Chien-Yi Lo, Guangdong (CN); Rong-Che Chen, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 11/162,836

(22) Filed: Sep. 26, 2005

(65) Prior Publication Data

US 2006/0221570 A1    Oct. 5, 2006

(30) Foreign Application Priority Data

Apr. 1, 2005    (TW) .............................. 94205122 U

(51) Int. Cl.
*H05K 7/20* (2006.01)

(52) U.S. Cl. ..................... 361/695; 361/719; 165/80.3; 257/719

(58) Field of Classification Search ..................... None
See application file for complete search history.

(56) References Cited

U.S. PATENT DOCUMENTS

| | | | | |
|---|---|---|---|---|
| 5,630,469 A | * | 5/1997 | Butterbaugh et al. | 165/80.3 |
| 5,936,836 A | * | 8/1999 | Scholder | 361/695 |
| 6,304,445 B1 | * | 10/2001 | Bollesen | 361/697 |
| 6,667,882 B2 | * | 12/2003 | Pauser | 361/695 |
| 6,711,013 B2 | * | 3/2004 | Wobig et al. | 361/687 |
| 6,711,016 B2 | * | 3/2004 | Chung et al. | 361/695 |
| 6,736,196 B2 | | 5/2004 | Lai et al. | |
| 6,921,328 B1 | * | 7/2005 | Nohara et al. | 454/184 |
| 2003/0198016 A1 | * | 10/2003 | Wobig et al. | 361/687 |
| 2006/0238979 A1 | * | 10/2006 | Liu | 361/699 |

* cited by examiner

*Primary Examiner*—Boris Chervinsky
(74) *Attorney, Agent, or Firm*—Winston Hsu

(57) ABSTRACT

A cooling device includes a heat sink (10), a fan (30), and a fan duct (50) covering the heat sink and fan therein. The heat sink includes a base (12) defining at least a through hole (18) at each of two opposite sides thereof. The fan duct comprises a top wall (52) and two side walls (54). A mounting portion (60) extends outwardly from a bottom of each side wall and has at least a tube (64) defining a mounting hole (640) in an outer wall thereof. A plurality of pins (70) extends through the through holes into the tubes. The pins have retaining rings (74) abutting against a bottom surface (120) of the base of the heat sink, and hooks (76) locked in the mounting holes.

14 Claims, 8 Drawing Sheets

COOLING DEVICE FOR HEAT-GENERATING ELECTRONIC COMPONENT

FIELD OF THE INVENTION

The present invention relates to a cooling device for dissipation of heat from a heat generating device, and particularly to a cooling device having a fan duct.

DESCRIPTION OF RELATED ART

As electronic industry continues to advance, electronic components such as central processing units (CPUs), are made to provide faster operational speeds and greater functional capabilities. When a CPU operates at a high speed, its temperature frequently increases greatly. It is desirable to dissipate the heat generated by the CPU quickly. To solve this problem of heat generated by the CPU, a cooling device is often used to be mounted on top of the CPU to dissipate heat generated thereby.

A conventional cooling device comprises a heat sink and a fan for generating forced airflow to the heat sink to thereby enhance the heat dissipation capability of the heat sink. The heat sink comprises a base for contacting with the CPU to absorb heat therefrom and a plurality of fins arranged on the base. An air passage is formed between each two neighboring fins. The fan is arranged at a side of the heat sink facing the air passages. However, in this kind of cooling device a backflow is usually generated in the air passages when the airflow of the cooling fan flows therethrough. The heat transfer effect of the cooling device is therefore reduced.

Subsequently, a fan duct have been developed to be incorporated into the cooling device. The fan duct is fixed on the fan and extends to the heat sink. A mounting member is secured on the heat sink for connecting the fan duct and the heat sink together. By the fan duct, the backflow in the conventional cooling device is prevented from being generated. However, since the fan duct is connected with the heat sink via the mounting member, it is complicated to assembly the cooling device. Also the cost of production and assembly of the cooling device is high.

For the foregoing reasons, therefore, there is a need in the art for a cooling device which overcomes the above-mentioned problems.

SUMMARY OF THE INVENTION

According to a preferred embodiment of the present invention, a cooling device includes a heat sink, a fan arranged at a side of the heat sink for generating an airflow to the heat sink and a fan duct assembly covering the heat sink and fan therein. The heat sink includes a base defining at least a through hole at each of two opposite sides thereof. The fan duct assembly comprises a fan duct having a top wall and two side walls extending downwardly from two opposite sides of the top wall and a plurality of pins. A mounting portion extends outwardly from a bottom of each of the side walls and defines a plurality of tubes each corresponding to each through hole of the heat sink. The pins pass through the through holes and are locked in the tubes, respectively. Each of the pins has a retaining ring and a hook at opposite ends thereof, respectively. The retaining ring abuts against a bottom surface of the base of the heat sink, and the hook engages in a mounting hole defined in an outer wall of a corresponding tube.

Other objects, advantages and novel features of the present invention will be drawn from the following detailed description of a preferred embodiment of the present invention with attached drawings, in which:

DETAILED DESCRIPTION

Figure 1:
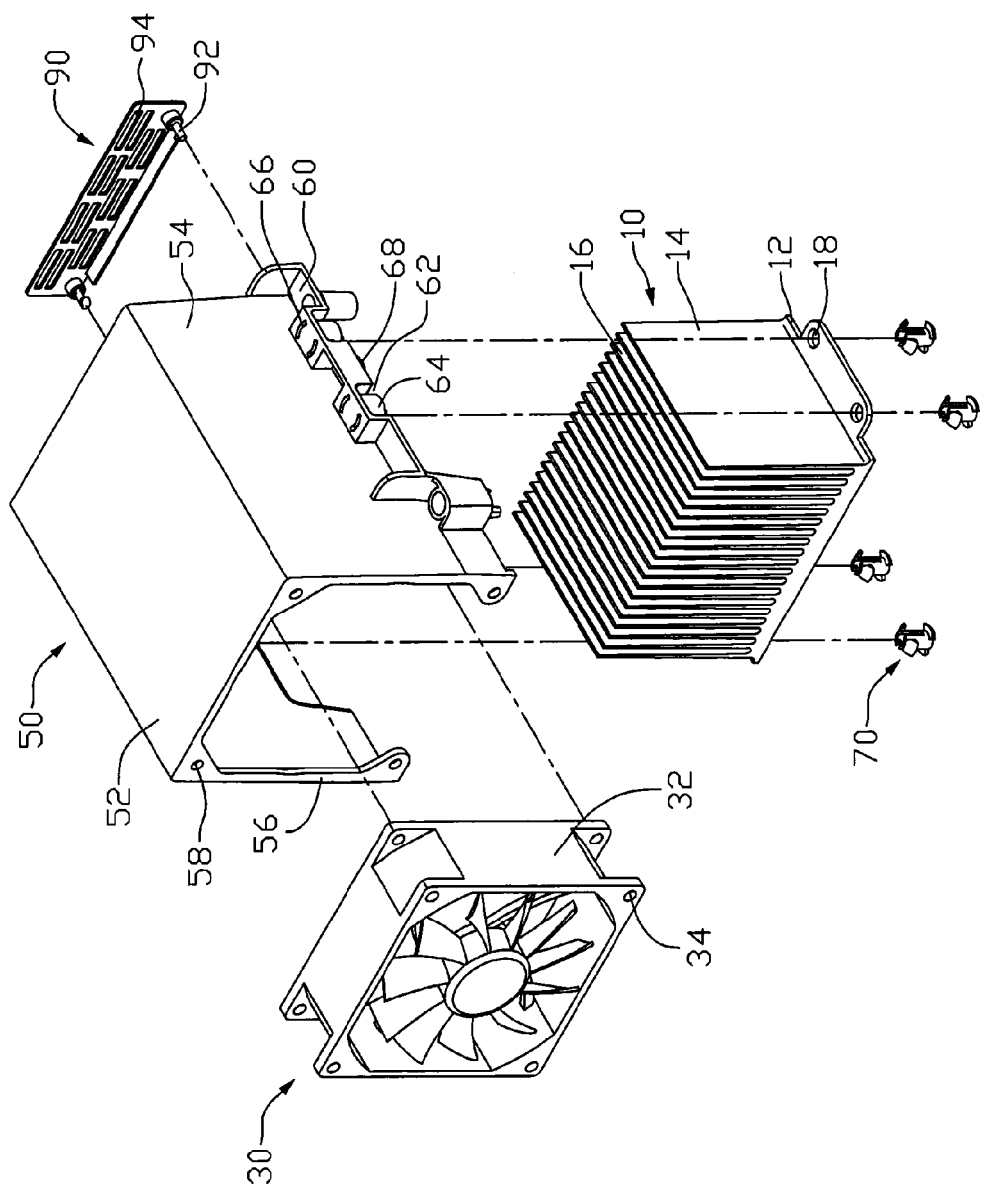
FIG. 1 is an exploded, isometric view of a cooling device in accordance with a preferred embodiment of the present invention.
Figure 2:
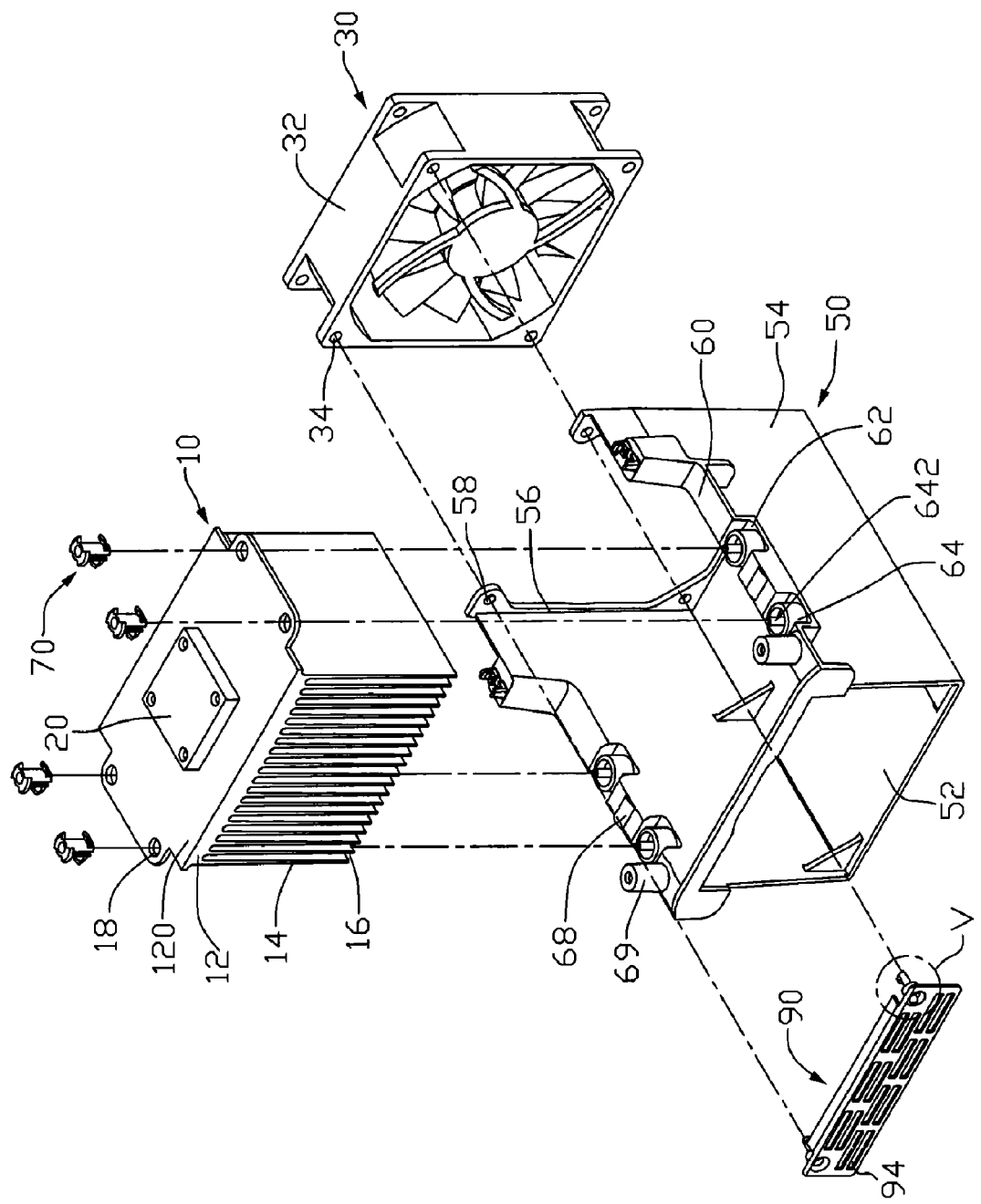
FIG. 2 is an exploded, isometric view of the cooling device viewed from another aspect.

FIGS. 1-2 show a cooling device in accordance with a preferred embodiment of the present invention. The cooling device comprises a heat sink 10, a fan 30 for generating an airflow to the heat sink 10 and a fan duct assembly covering the fan 30 and heat sink 10 therein.

The heat sink 10 comprises a base 12 and a plurality of fins 14 arranged on the base 12. The heat sink 10 is made of aluminum extrusion. The base 12 has a bottom surface 120 attached with a heat spreader 20 which is made of copper. Copper has better heat conductivity than aluminum. The heat spreader 20 is for thermally contacting with a heat generating device, such as a CPU (not shown) which is mounted on a circuit board (not shown). The fins 14 extend from the base 12 in a direction away from the bottom surface 120. An air passage 16 is defined between two neighboring fins 14. A pair of through holes 18 is defined in each of two opposite side plates (not labeled) of the base 12. The side plates extend parallel to the air passages 16 of the heat sink 10. The through holes 18 are used for securing the heat sink 10 and the fan duct assembly together.

The fan 30 is to be located at a front side of the heat sink 10 facing the air passages 16 of the heat sink 10, whereby an airflow generated by the fan 30 can directly flow through the air passages 16. The fan 30 comprises a square shaped frame 32 defining an aperture 34 in each of four corners thereof.

The fan duct assembly comprises a fan duct 50 for covering the fan 30 and heat sink 10 therein and a plurality of pins 70 for securing the fan duct 50 with the heat sink 10.

The fan duct 50 comprises a top wall 52 and a pair of side walls 54 extending downwardly from two opposite sides of the top wall 52 respectively. Each of bottom ends of the side walls 54 forms a stepped configuration. A flange 56 extends inwardly from a front edge of the fan duct 50 near the fan 30. Four bores 58 are defined in the flange 56 corresponding to the apertures 34 of the fan 30.

Figure 3:
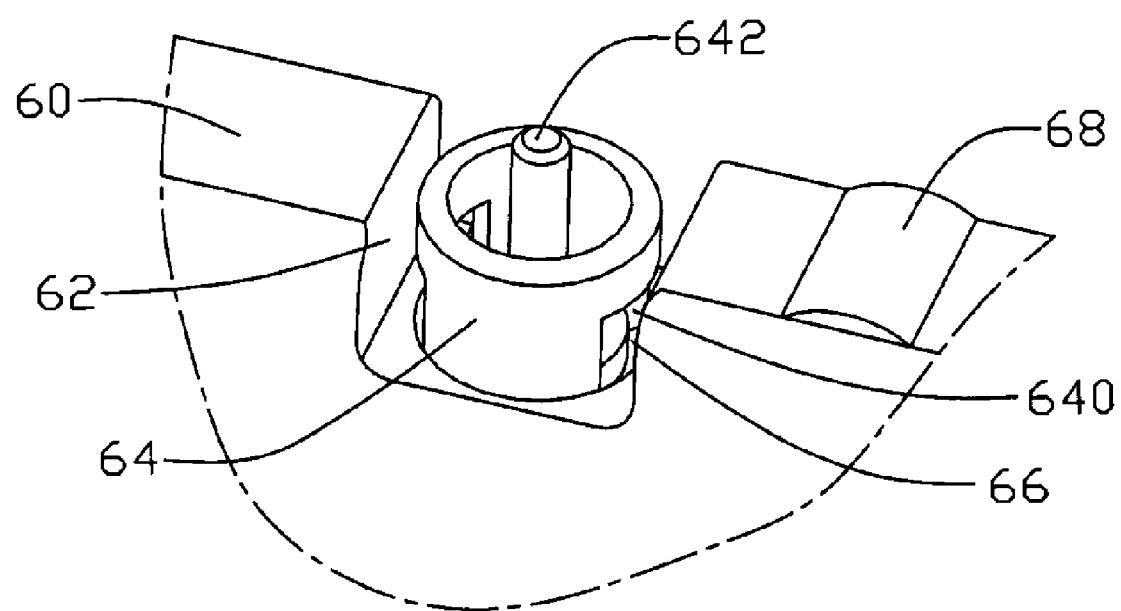
FIG. 3 is a partially enlarged view of a fan duct shown in FIG. 2.

Referring also to FIG. 3, a mounting portion 60 extends outwardly from the bottom end of each of the side walls 54. Each mounting portion 60 defines two grooves 62 in a bottom thereof, corresponding the two through holes 18 in each of the side plates of the base 12. A tube 64 is formed in each groove 62 of the mounting portion 60. A pair of mounting holes 640 is defined in an outer wall of the tube 64. A pole 642 extends downwardly from a central portion of the tube 64 for locating the fan duct 50 in an assembly of the cooling device. A protrusion 68 extends downwardly from the bottom of each of the mounting portions 60. Each protrusion 68 is formed between the grooves 62 of each mounting portion 60. An outer surface of the protrusion 68 is arc shaped. The mounting portion 60 is integrally formed with the fan duct 50. A pair of arc-shaped holes 66 is defined in the mounting portion 60 above a corresponding groove 62. Each arc-shaped hole 66 communicates with a corresponding mounting hole 640. Two posts 69 extend downwardly from the two mounting portions 60 near a rear part thereof, for securing the cooling device with the circuit board (not shown).

Figure 4:
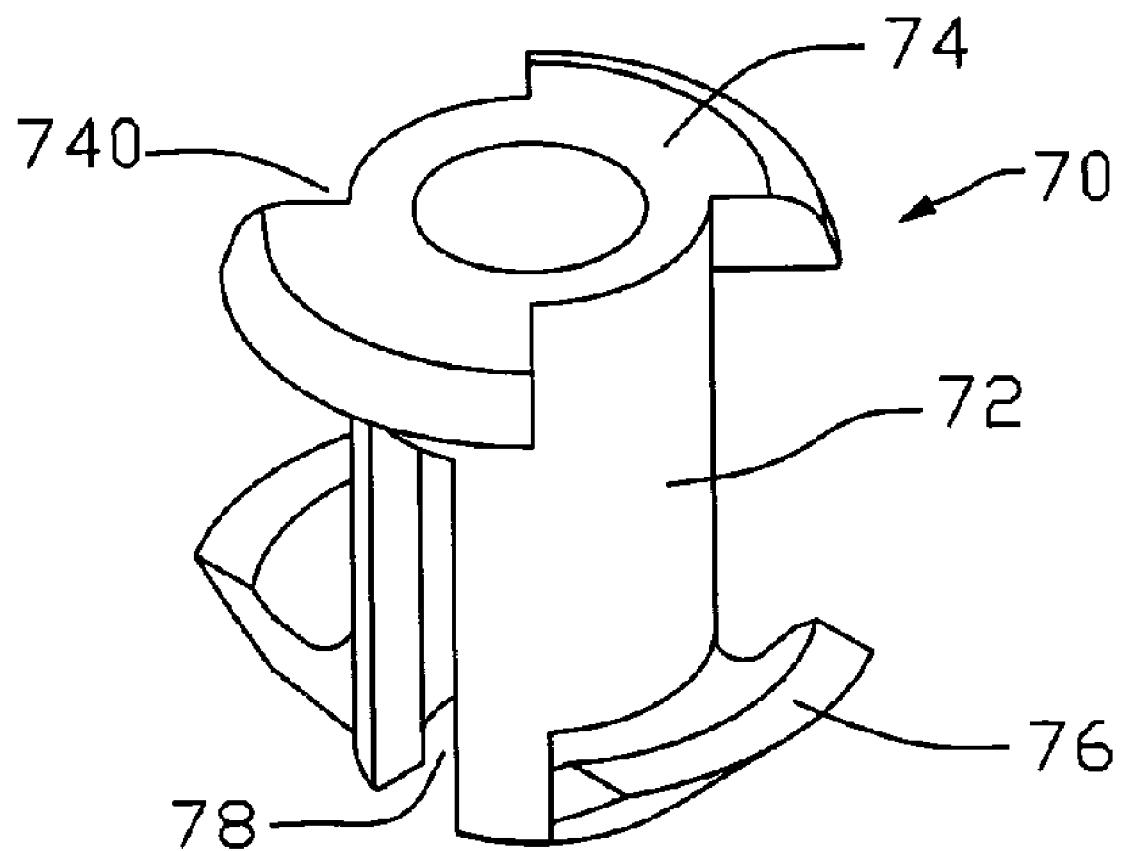
FIG. 4 is an enlarged, isometric view of a pin shown in FIG. 2.

Referring to FIGS. 1, 2 and 4, four pins 70 are adopted for securing the heat sink 10 and the fan duct 50 together. Each of the pins 70 is integrally formed. Each pin 70 comprises a main body 72 having a diameter approximately the same as or less than a bore diameter of the tube 64, a pair of hooks 76 extending oppositely, downwardly and aslant from a top end of the main body 72, and a retaining ring 74 extending outwardly from a bottom end of the main body 72. Thus an outer diameter of the hooks 76 or retaining ring 74 is larger than the bore diameter of the tube 64. A pair of notches 740 is defined symmetrically in the retaining ring 74. The hooks 76 are positioned in line with the notches 740 along an axial direction of the pin 70. Thus, the retaining ring 74 and the hooks 76 are alternately arranged along a circumferential direction of the pin 70 from a top view thereof. A pair of slots 78 is defined in the main body 72 for enhancing the flexibility of the pin 70, particularly for enhancing the flexibility of the hooks 76.

Figure 5:
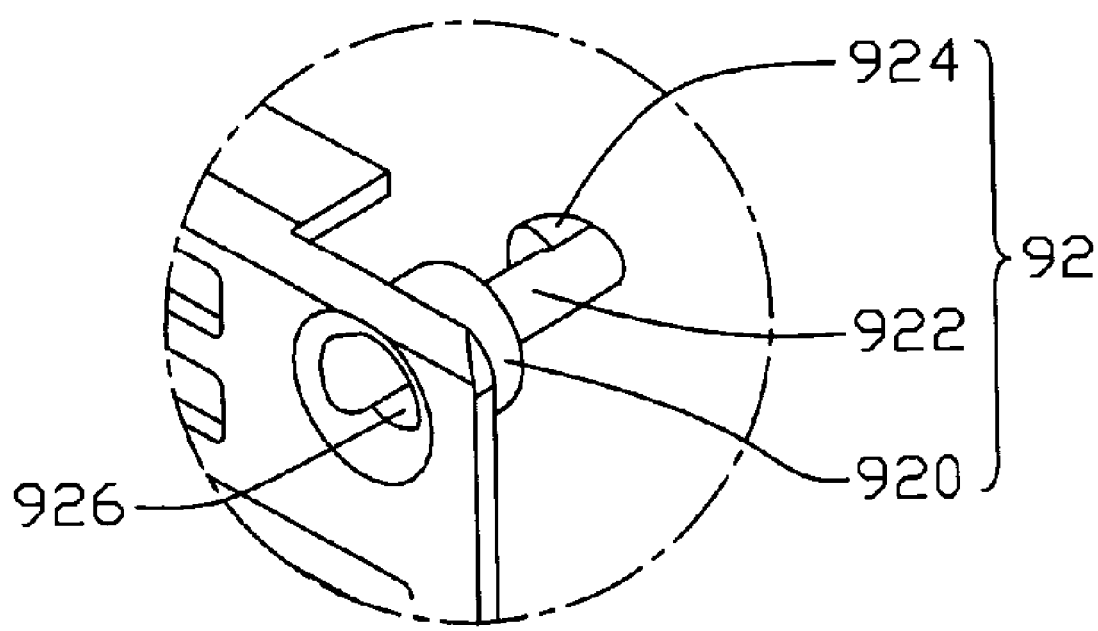
FIG. 5 is an enlarged view of a circled portion V of FIG. 2.

Referring to FIGS. 1, 2 and 5, the fan duct assembly further comprises a louver 90 for covering a lower portion of a rear side of the fan 30. A plurality of loopholes 94 is defined in the louver 90 for the airflow generated by the fan 30 flowing therethrough. Two rods 92 extend forwardly from two lower corners of the louver 90, respectively, corresponding to the apertures 34 defined in the lower portion of the fan 30. The rods 92 are integrally formed with the louver 90 for securing the louver 90 with the fan 30. Each rod 92 comprises a body 922 and top and bottom heads 924, 920 formed at two opposite ends of the body 922, respectively. The diameter of the body 922 is not larger than the aperture 34 of the fan 30. The heads 924, 920 have a larger diameter than the aperture 34 of the fan 30. An orifice 926 is defined in the louver 90 corresponding to the top head 924.

Figure 6:
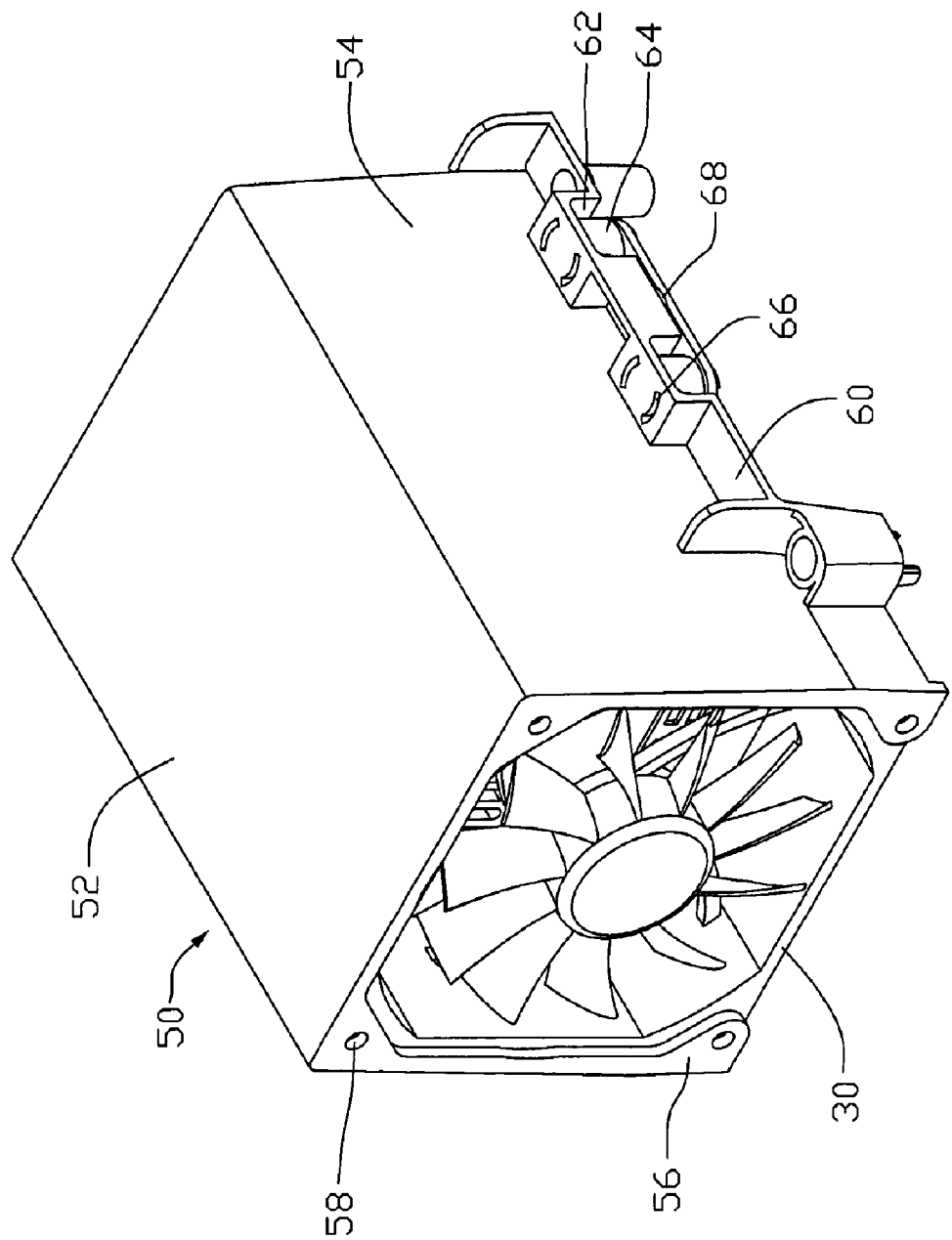
FIG. 6 is an assembled, isometric view of FIG. 1.
Figure 7:
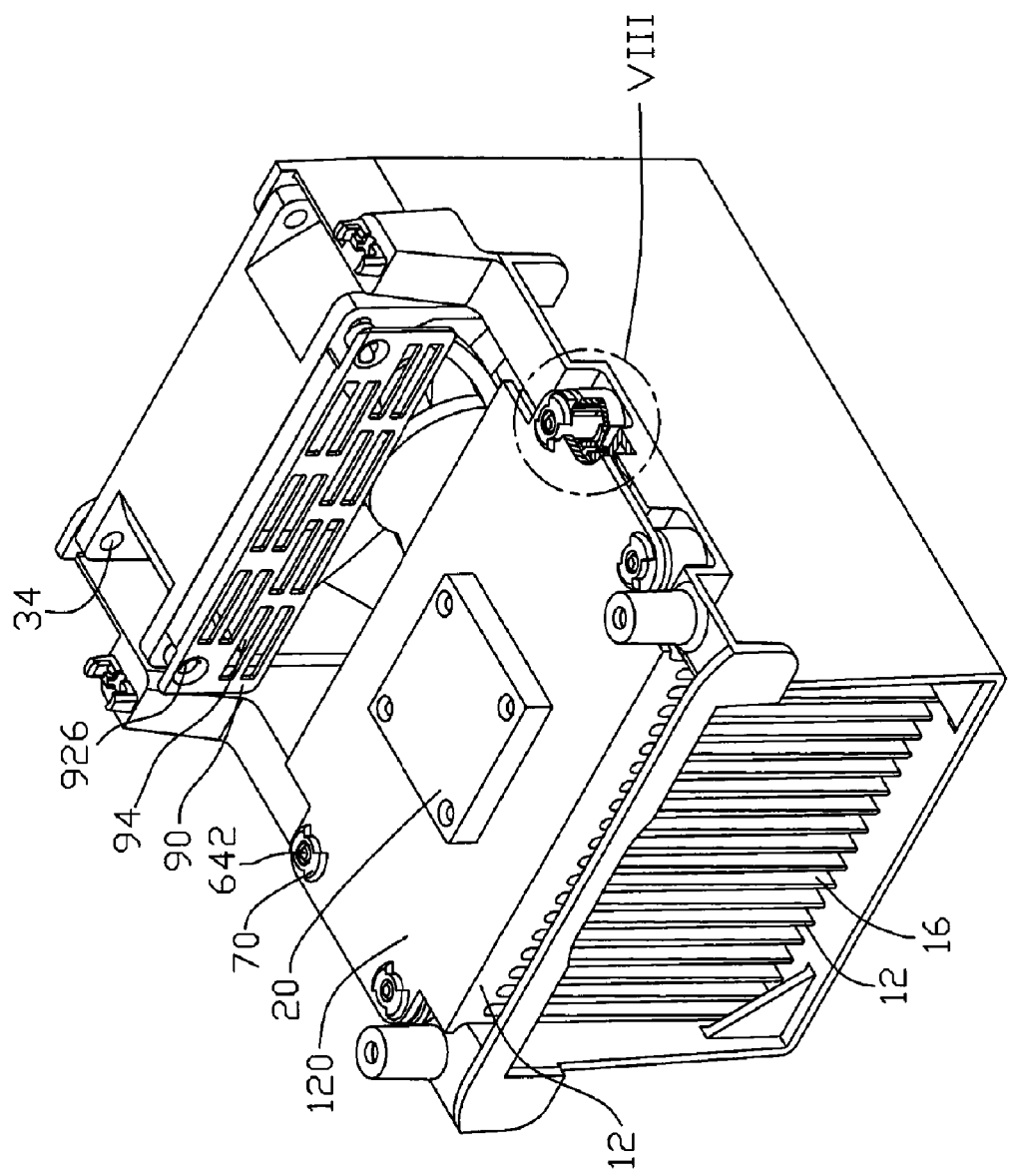
FIG. 7 is an assembled, isometric view of FIG. 2 with a portion being cut away.
Figure 8:
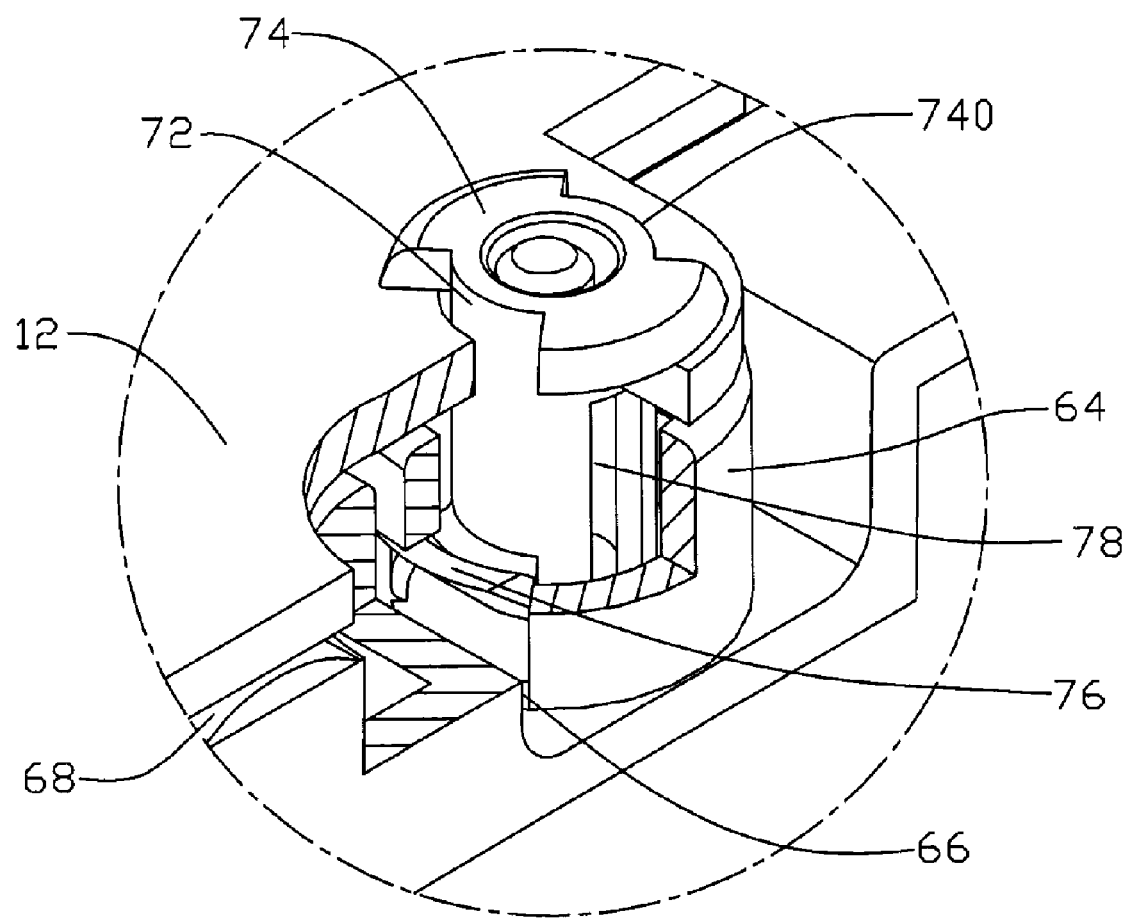
FIG. 8 is an enlarged view of a circled portion VIII of FIG. 7.

Referring to FIGS. 6-8, in assembly, the fan duct 50 covers on the heat sink 10 and fan 30 wherein the fan 30 is mounted in a front part of the fan duct 50 and the heat sink 10 is mounted in a rear part of the fan duct 50. The louver 90 is connected with the fan 30 by extending the rods 92 into the corresponding apertures 34 of the fan 30 near the heat sink 10 until the heads 924, 920 of the rods 92 tightly sandwich a wall of the frame 32 of the fan 30. Four screws (not shown) extend through the bores 58 of the flange 56 of the fan duct 50 and screw into the corresponding apertures 34 of the frame 32 of the fan 30. The tubes 64 of the fan duct 50 are mounted just on the through holes 18 of the heat sink 10 respectively. Each pole 642 of each tube 64 enters into a corresponding through hole 18 of the heat sink 10 for locating the fan duct 50 on the heat sink 10 initially.

Then the pins 70 are pushed upwardly from the bottom surface 120 of the heat sink 10 into the through holes 18. Each pin 70 extends through a corresponding through hole 18 of the heat sink 10 into the tube 64. The retaining rings 74 abut the bottom surface 120 of the heat sink 10. The hooks 76 of pins 70 are locked in the mounting holes 640, respectively. Thus, the cooling device is assembled. The fan duct 50 and the heat sink 19 of the cooling device are assembled together only by the pins 70. The mounting member in the conventional cooling device is omitted. Thus the cost for production or assembly is decreased; the process of assembly is also simplified. For the protrusions 68 formed between the grooves 62 of each of the mounting portions 60, they are used to abut downwards against the side plates of the base 12 of the heat sink 10 thereby enabling the bottom surface 120 of the heat sink 10 to have a tight engagement with the retaining rings 74.

During operation of the fan 30, a part of the airflow generated by the fan 30 flows to the heat sink 10 thereby taking heat away from the fins 14 of the heat sink 10. The other part of the airflow flows through the loopholes 94 of the louver 90 to the heat spreader 20, the CPU (not shown) engaging with the heat spreader 20 and other heat-generating electronic components (not shown) around the CPU. Thus, not only the CPU is cooled, but also other electronic components on the circuit board (not shown) near the CPU can be cooled in the same time. By the present invention, the airflow generated by the fan is best utilized. The heat dissipation efficiency of the cooling device is improved.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A cooling device comprising:
   a heat sink having a base defining a through hole at each of two opposite sides thereof;
   a fan for generating an airflow to the heat sink; and
   a fan duct assembly covering the heat sink and fan therein, the fan duct assembly comprising a fan duct having a top wall and two side walls extending downwardly from two opposite sides of the top wall and a plurality of pins, a mounting portion extending outwardly from each side wall and defining a tube corresponding to the through hole of the heat sink, the pins passing through the through holes and locked in the tubes, respectively;
   wherein the mounting portion defines a groove above a corresponding through hole, and the tube extends downwardly in the groove and defines a mounting hole in an outer wall thereof.

2. The cooling device as claimed in claim 1, wherein a pole extends downwardly from a central portion of the tube into a corresponding pin.

3. The cooling device as claimed in claim 1, wherein the fan duct is integrally formed, and an arc hole is defined in the mounting portion corresponding to the mounting hole.

4. The cooling device as claimed in claim 1, wherein a protrusion extends downwardly from a bottom surface of the mounting portion and abuts the base of the heat sink.

5. The cooling device as claimed in claim 4, wherein the protrusion has an arc shaped outer surface.

6. The cooling device as claimed in claim 1, wherein a post extends downwardly from the mounting portion for securing the cooling device on a circuit board.

7. The cooling device as claimed in claim 1, wherein the fan defines a plurality of apertures, and a flange extends inwardly from a front edge of the fan duct near the fan, a plurality of bores being defined in the flange corresponding to the apertures of the fan.

8. The cooling device as claimed in claim 1 further comprising a louver connected with a lower portion of the fan, a plurality of loopholes being defined in the louver.

9. The cooling device as claimed in claim 8, wherein the louver comprises a rod having a body and top and bottom heads, and the body is received in a corresponding aperture of the fan and the top and bottom heads sandwiches a wall of a frame of the fan therebetween.

10. The cooling device as claimed in claim 9, wherein the louver is integrally formed with the rod and defines an orifice corresponding to the top head of the rod distant from the louver.

11. The cooling device as claimed in claim 1, wherein each of the pins comprises a main body and a hook formed at a top end of the main body and a retaining ring formed at a bottom end of the main body, the retaining ring abutting a bottom surface of the heat sink.

12. The cooling device as claimed in claim 11, wherein a slot is defined in the main body of each of the pins for enhancing flexibility of the pins.

13. The cooling device as claimed in claim 12, wherein the hook extends downwardly and aslant from the top end of the main body.

14. The cooling device as claimed in claim 13, wherein the retaining ring and the hook are alternately arranged along a circumferential direction of each of the pins.

\* \* \* \* \*